United States Patent
Chen et al.

(10) Patent No.: US 6,878,504 B2
(45) Date of Patent: Apr. 12, 2005

(54) CHEMICALLY-AMPLIFIED RESIST COMPOSITIONS

(75) Inventors: Chi-Sheng Chen, Sanchung (TW); Chan-Chan Tsai, Bade (TW); Bin Jian, Jungli (TW); Hsin-Ming Liao, Yunlin Hsien (TW)

(73) Assignee: Everlight USA, Inc., Pineville, NC (US)

( * ) Notice: Subject to any disclaimer, the term of this patent is extended or adjusted under 35 U.S.C. 154(b) by 0 days.

(21) Appl. No.: 10/445,924

(22) Filed: May 28, 2003

(65) Prior Publication Data

US 2004/0241569 A1 Dec. 2, 2004

(51) Int. Cl.$^7$ .............................................. G03F 7/004
(52) U.S. Cl. .................... 430/270.1; 430/905; 430/909; 430/910
(58) Field of Search ............................. 430/270.1, 905, 430/909, 910

(56) References Cited

U.S. PATENT DOCUMENTS

| | | | | |
|---|---|---|---|---|
| 6,303,266 B1 | * | 10/2001 | Okino et al. | 430/270.1 |
| 6,348,297 B1 | * | 2/2002 | Uetani et al. | 430/270.1 |
| 6,391,520 B1 | * | 5/2002 | Nakano et al. | 430/270.1 |
| 6,461,788 B1 | * | 10/2002 | Miwa et al. | 430/270.1 |
| 6,517,993 B1 | * | 2/2003 | Nakamura et al. | 430/270.1 |
| 6,586,157 B1 | * | 7/2003 | Hasegawa et al. | 430/285.1 |
| 6,673,513 B1 | * | 1/2004 | Choi et al. | 430/270.1 |
| 6,713,228 B1 | * | 3/2004 | Kim et al. | 430/270.1 |

* cited by examiner

Primary Examiner—John S. Chu
(74) Attorney, Agent, or Firm—Bacon & Thomas, PLLC

(57) ABSTRACT

A chemically-amplified resist composition is disclosed, which comprises a polymer of formula (I) below:

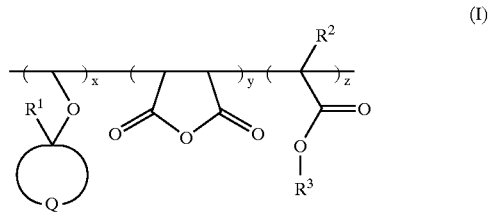

(I)

wherein $R^1$ is H, $C_1$–$C_4$ alkyl, or $CF_3$; Q is $C_4$–$C_{12}$ cycloalkyl; $R^2$ is H, $C_1$–$C_4$ alkyl, or $CF_3$; $R^3$ is $C_4$–$C_{12}$ branched or cyclic alkyl; and x+y+z equals to 1. The chemically-amplified resist compositions of the present invention not only can be applied maturely to general lithographic processes, especially to 193 nm lithographic process, but also have excellent photosensitivity, and can form a well-resolved pattern and profile.

18 Claims, No Drawings

CHEMICALLY-AMPLIFIED RESIST COMPOSITIONS

BACKGROUND OF THE INVENTION

1. Field of the Invention

The present invention relates to a resist composition and, more particularly, to a chemically-amplified resist composition that contains a novel polymer.

2. Description of Related Art

As the integration level of the semiconductor integrated circuits (ICs) rapidly increases, the line width required for the lithography technique becomes smaller and smaller. Theoretically, the smaller the wavelength of the light source, or the bigger the numerical aperture (NA) of the optics system, the better the resolution of the pattern made by lithographic process will be. Due to the design rule of the ICs for the mass production of 1 G byte DRAM, it is necessary for manufacturers to advance research in the 0.13 µm lithographic process. However, the KrF (248 nm) excimer laser currently used is no longer competent to facilitate the processes under 0.13 µm. As a result, the ArF (193 nm) excimer laser has become the essential device in this field.

Currently, the most promising technique for advancing development in the 0.09 µm (90 nm) lithographic process is the ArF lithographic process utilizing chemically-amplified resists. Nevertheless, the 193 nm resists need to meet the properties of high resolution, long depth of focus (DOF) and process window, good thermal stability and adhesion, high sensitivity (<5 mj/cm$^2$), excellent resistance to plasma etching, moderate rate of dissolution, and being compatible to the standard chemicals used for IC production, such as the 2.38% TMAH developer.

In the early days of research of the 193 nm resist, the focus was mainly on acrylic polymer. In order to improve the polymer's resistance against etching and hydrophilicity, many polymers having cyclic structure, such as Cyclo-Olefin-co-Maleic Anhydride (referred to as COMA hereinafter), Cyclo-Olefin Copolymer (referred to as COC hereinafter), and Cyclo-Olefin-co-Maleic anhydride-co-acrylate were developed. However, those polymers mentioned above are not easy to be synthesized. For example, the synthesis has to be catalyzed by rare elements like transition metals. After the synthesis, it is hard to remove the metallic ions from the synthesized polymer. Besides, the synthesized products have excessively high absorbance and poor hydrophilicity so it is still necessary to develop a new polymer from which the foregoing disadvantages are absent.

Vinyl Ether-Maleic Anhydride copolymer (referred to as VEMA hereinafter) has the advantages that it can overcome the drawbacks of those co-polymers above-mentioned. For example, VEMA can be synthesized by using a much easier method of radial polymerization; the resist made by VEMA has excellent adhesion to the substrates; and it has better resistance against etching than the acrylates, and lower absorbance than norbornene-series polymers.

In recent years, some VEMA-related literature has been published. Firstly, the structure of VEMA polymer was proposed in *Proceedings of SPIE*, 3999, 54–61 by Sang-Jun Choi et al. (2000). That publication combined Maleic anhydride, acid-labile acrylates, and linear alkyl vinyl ether or cyclic vinyl ether compounds such as 3,4-dihydro-2H-pyran (DHP) or 3,4-dihydro-2-ethoxy-2H-pyran (DHEP) to form a co-polymer.

George G. Barclay et al. disclosed in U.S. Pat. No. 6,306,554 a polymer with a similar structure to that of Sang-Jun Choi. A norbornene was added to adjust the properties of the polymer. In addition to DHEP, the vinyl ether disclosed in the patent further includes cyclic vinyl ether compounds such as 3,4-dihydro-2-mthoxy-2H-pyran (DHMP). Preferably, the molecular weight of this kind of high polymer ranges from 2,000 to 20,000, the polymerization-dispersion degree is about or less than 2, and the molar ratio of the acid-labile acrylate to the high polymer is from 40 to 60%.

Nevertheless, the VEMA polymer disclosed above is not satisfactory because it uses a vinyl ether compound with cycloalkyl-substituted main chain, which results in poorer polymerization activity than that which uses a vinyl ether compound with cycloalkyl substituted at side-chain. Therefore, the polymer has a lower uniformity in the compositions of chain structure, low synthesis yield and molecular weight, higher degree of polymerization-dispersion, and a more complex synthesizing reaction. Particularly, introducing another norbornene made the degree difficulty of synthesis rise, as well as being difficult to control.

Although vinyl ether having a linear substituent at side chain can get a polymer with high uniformity of chain composition, high synthesis yield and molecular weight, and narrow degree of polymerization-dispersion, its resistance against etching is too weak. The present invention uses vinyl ether with a cycloalkyl substituent at a side chain that has both good activity and etching resistance, Maleic anhydride, and acid-labile acrylates to build a polymer with excellent reaction activity and resistance against etching.

Reppe et al. first synthesized vinyl ether in 1956. Alcohol was allowed to react with acetylene under high pressure (20~50 atm) and high temperature (180–200° C.), and catalyzed by potassium hydroxide or organic metal catalyst, e.g., Y. Okimoto et al. (2002) in *J. Am. Chem. Soc.*, 124, 1590. However, B. A. Trofimov et al. (2000) disclosed a more moderate reaction condition in *Synthesis*, 11, 1521 that involved dissolving alcohol and potassium hydroxide in DMSO followed by reacting with acetylene to synthesize certain kinds of vinyl ether compounds.

The present invention discloses compositions of VEMA polymer, which must not contain more than 40 molar percent of acid-labile acrylate like the prior art aforementioned, but can get better properties of hydrophilicity, adhesion, resistance against dry-etching, thermal properties, and transmittance by adjusting the percentage of acid-labile acrylates in the polymer, which makes the resists applied be more flexible.

The present invention further provides polymers, which are formed by introducing another acrylate with a cycloalkyl into the polymer aforementioned, which solves the problems that come about when introducing a norbornene and is easier to be synthesized and controlled. The acrylates with a cycloalkyl work well in adjusting the properties of the polymer in the resist. Adjusting the ratio of acrylates to acid-labile acrylates can regulate the hydrophilicity, adhesion, resistance against dry-etching, thermal property, and transmittance of the polymer, and then provides more flexible and more diverse techniques that can improve the properties of the polymer. As a result, the polymer makes lithographic process form images with better resolution, profile, and light-sensitivity.

The resist composition of the present invention has good hydrophilicity, adhesion, and resistance against dry etching, which improves the adherence between the resist and the substrate, enhances its shaping ability, and strengthens the resist pattern after being developed. Besides, the better hydrophilicity makes the developer solution disperse on the resist more uniformly, which results in good and uniformly resolved images.

SUMMARY OF THE INVENTION

The present invention provides a chemically-amplified resist composition, which has good photo-sensitivity, yields well-resolved images and patterns after being developed, and is applicable to a photolithographic process.

The chemically-amplified resist composition of the present invention, which has good photo-sensitivity, yields well-resolved images and patterns after being developed is suitable for use in 193 nm or 157 nm lithographic processes.

To achieve the object, the chemically-amplified resist composition of the present invention includes a polymer of the following formula (I):

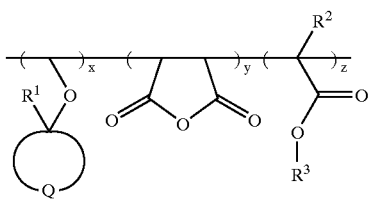

(I)

wherein $R^1$ is H, $C_1$–$C_4$ alkyl, or $CF_3$; Q is $C_4$–$C_{12}$ cycloalkyl; $R^2$ is H, $C_1$–$C_4$ alkyl, or $CF_3$; $R^3$ is $C_4$–$C_{12}$ branched or cyclic alkyl; and x+y+z equals to 1.

In the structure of the formula (I) listed above, preferably Q is selected from the group consisting of cyclohexyl, isobornyl, adamantyl, tricyclo[5.2.1.0$^{2,6}$]dec-8-yl, and tetracyclo[6.2.1.1$^{3,6}$.0$^{2,7}$]dodec-9-yl. $R^3$ is preferably a tetra-carbide, such as tert-butyl, 1-methyl-1-cyclohexyl, 1-ethyl-1-cyclohexyl, 2-methyl-2-adamantyl, 2-ethyl-2-adamantyl, 8-methyltricyclo[5.2.1.0$^{2,6}$]dec-8-yl, 8-ethyltricyclo[5.2.1.0$^{2,6}$]dec-8-yl, 9-methyltetracyclo[6.2.1.1$^{3,6}$.0$^{2,7}$]dodec-9-yl, or 9-ethyltetracyclo[6.2.1.1$^{3,6}$.0$^{2,7}$]dodec-9-yl.

In the structure of the formula (I) listed above, preferably x/(x+y+z) ranges from 0.1 to 0.45, y/(x+y+z) ranges from 0.1 to 0.45, and z/(x+y+z) ranges from 0.1 to 0.8.

The polymer containing the formula (I) aforementioned preferably has a glass transition temperature (Tg) ranging from 50 to 350° C., a molecular weight (Mw) ranging from 1,000 to 300,000, a polymerization-dispersion index (PDI) ranging from 1 to 3, and a temperature of degradation (Td) greater than 80° C. The polymer of the present invention is a co-polymer of Maleic anhydride, cycloalkyl vinyl ether, and an acrylate with a protective group, wherein the polymerization structure is alternated with Maleic anhydride and vinyl ether, and named VEMA.

The present invention further discloses a chemically-amplified resist composition which includes a polymer of repetitive formula (II) below:

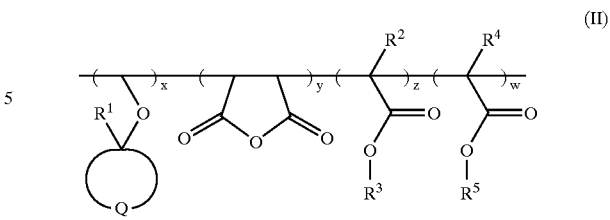

(II)

wherein $R^1$ is H, $C_1$–$C_4$ alkyl, or $CF_3$; Q is $C_4$–$C_{12}$ cycloalkyl; $R^2$ is H, $C_1$–$C_4$ alkyl, or $CF_3$; $R^3$ is $C_4$–$C_{12}$ branched or cyclic alkyl; $R^4$ is H, $C_1$–$C_4$ alkyl, or $CF_3$; $R^5$ is $C_4$–$C_{12}$ cycloalkyl; and x+y+z+w equals to 1.

As to formula (II), Q is preferably selected from the group consisting of cyclohexyl, isobornyl, adamantyl, tricyclo[5.2.1.0$^{2,6}$]dec-8-yl, and tetracyclo[6.2.1.1$^{3,6}$.0$^{2,7}$]dodec-9-yl. Preferably $R^3$ is tert-butyl, 1-methyl-1-cyclohexyl, 1-ethyl-1-cyclohexyl, 2-methyl-2-adamantyl, 2-ethyl-2-adamantyl, 8-methyltricyclo[5.2.1.0$^{2,6}$]dec-8-yl, 8-ethyltricyclo[5.2.1.0$^{2,6}$]dec-8-yl, 9-methyltetracyclo[6.2.1.1$^{3,6}$.0$^{2,7}$]dodec-9-yl, or 9-ethyltetracyclo[6.2.1.1$^{3,6}$.0$^{2,7}$]dodec-9-yl. Preferably $R^5$ is cyclohexyl, isobornyl, adamantyl, tricyclo[5.2.1.0$^{2,6}$]dec-8-yl, or tetracyclo[6.2.1.1$^{3,6}$.0$^{2,7}$]dodec-9-yl.

In the structure of formula (II) listed above, preferably x/(x+y+z+w) ranges from 0.1 to 0.425, y/(x+y+z+w) ranges from 0.1 to 0.425, z/x+y+z+w) ranges from 0.1 to 0.8, and w/x+y+z+w) ranges from 0.05 to 0.5.

The polymer containing formula (II) aforementioned preferably has a glass transition temperature (Tg) ranging from 50 to 350° C., a molecular weight (Mw) ranging from 1,000 to 300,000, a polymerization-dispersion index (PDI) ranging from 1 to 3, and a temperature of degradation (Td) greater than 80° C.

The polymer of formula (II) is formed by introducing a cycloalkyl acrylate into formula (I) in order to adjust the properties of the resist.

The chemically-amplified resist is mainly composed of repetitive formula (I) or (II). The resist could optionally contain photo-acid generators, acid quenchers, additives, solvents, or combinations thereof.

The chemically-amplified resists of the present invention could be applied to general lithographic processes, especially to a 193 nm lithographic process. The resist also has good photo-sensitivity, and yields well-resolved images and patterns after being developed. Such a lithographic process is well known by those skilled in art and unnecessary details will not be given herein.

The present invention also relates to a method for applying the chemically-amplified resist compositions aforementioned to lithographic processes, particularly to the exposure at wavelength of 193 nm. The lithographic process of the present invention yields well-resolved images and profiles, and has excellent photo-sensitivity.

The resist composition of the present invention has good hydrophilicity, adhesion, and resistance against dry etching, which improves the adherence between the resist and the substrate, enhances its shaping ability, and strengthens the developed resist pattern. Besides, the better hydrophilicity makes the developer solution disperse on the resist more uniformly, which results in uniformly and precisely resolved images.

Other objects, advantages, and novel features of the invention will become more apparent from the following detailed description.

DETAILED DESCRIPTION OF THE PREFERRED EMBODIMENT

The polymer containing formula (I) or formula (II) of the present invention is a compound of repeated formula (III) below:

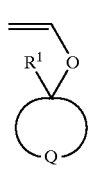

$R^1 = C_nH_{2n+1}(n = 0{\sim}4)$, $CF_3$
Q = Alicyclic group wherein $R^1$ is H, $C_1$–$C_4$ alkyl, or $CF_3$; and Q is $C_4$–$C_{12}$ cycloalkyl. The compound of formula (III) is a cyclic alkyl vinyl ether, i.e. a vinyl ether having a cycloalkyl at the side chain. If the compound of formula (III) proceeds a self-addition reaction under suitable conditions, a homo-polymer will be formed, and if the compound of formula (III) co-polymerizes with Maleic anhydride, an alternating copolymer will be formed.

The polymer containing formula (I) or formula (II) of the present invention is co-polymerized from the compound of formula (III) with Maleic anhydride, into which some kinds of acrylate that has a protective group or a cycloalkyl may be introduced to form a variety of polymers.

As to the preparation of the compound of formula (III), it can be synthesized according to, but is not limited to the following method:

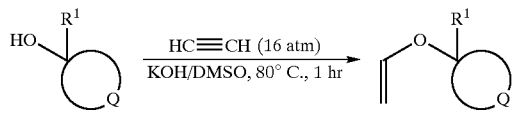

Acetylene was added into an alcohol in the KOH/DMSO system and was stirred for an hour under suitable pressure and temperature. After the solution was cooled down, some water was added for dilution. After being extracted, dried and concentrated, a light yellow cycloalkyl vinyl ether was formed.

The compound of formula (III) aforementioned can co-polymerize with Maleic anhydride and form an alternating co-polymer of formula (IV) shown below:

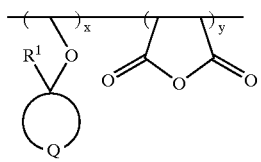

(IV)

$R^1 = C_nH_{2n+1}$ (n = 0~4), $CF_3$
Q = Alicyclic group wherein $R^1$ is H, $C_1$–$C_4$ alkyl, or $CF_3$; Q is $C_4$–$C_{12}$ cycloalkyl.

The polymer containing formula (I) or formula (II) of the present invention is co-polymerized from the compound of formula (III) with Maleic anhydride, into which some kinds of acrylate that have a protective or a cycloalkyl group may be introduced in order to form a variety of polymers. The key formula (III) could lower the reaction divergence between vinyl ether of the present invention and other monomers because the vinyl group is not contained in a cyclic alkyl moiety. Vinyl ether of the present invention has good resistance against etching because of its cycloalkyl substituent. Furthermore, it is an excellent polymer for producing resists due to its high polarity. The use of compound of formula (III) not only has to take the activity, resistance against etching, and polarity into consideration, but also must refer to the absorbance at wavelength of 193 nm, the adhesion with substrates, and the material cost. Some preferred compounds of formula (III) are listed below:
(wherein $R^1$ is H, $C_1$–$C_4$ alkyl, or $CF_3$)

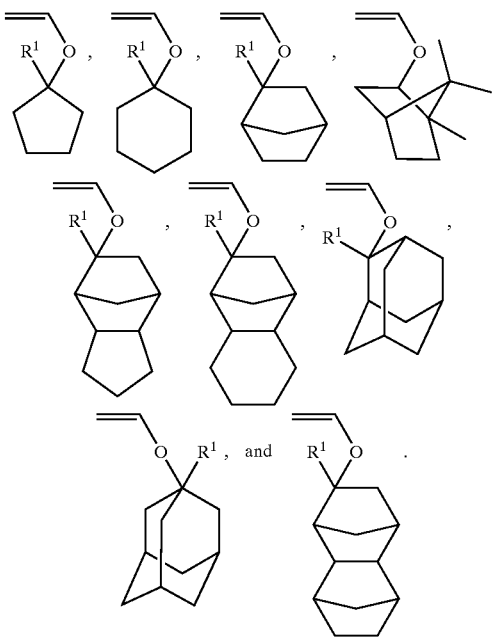

The acrylate having a protective group which will be added into the polymers containing formula (I) or formula (II) is not limited. The acrylate having a protective group that has a lower absorbance at wavelength of 193 nm is preferred, which will improve the transmittance of the polymer when used in the 193 nm lithographic process. In addition to the absorbance, polarity, adhension, etc. have to be taken into account further according to priority. The acrylates having a protective group are listed below:
(wherein $R^2$ is H, $C_1$–$C_4$ alkyl, or $CF_3$)

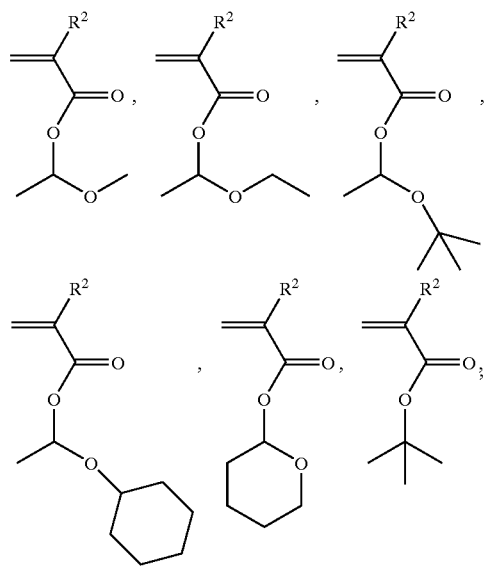

-continued

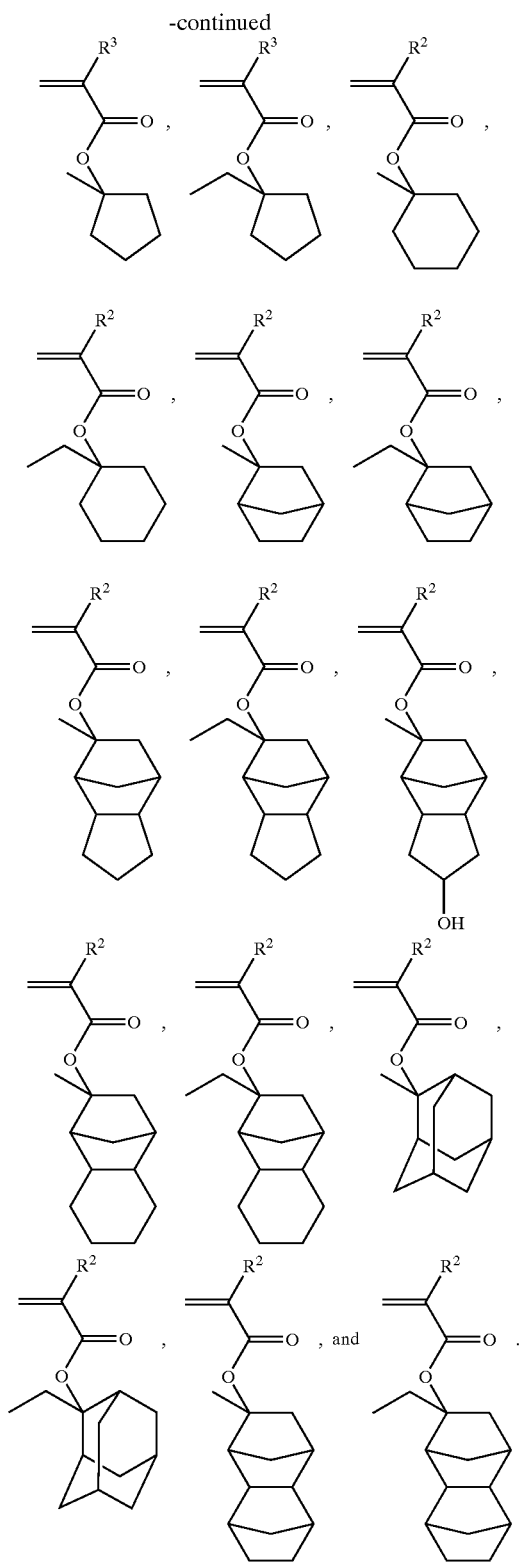

The present invention further discloses a polymer of formula (II), which is formed by introducing another cycloalkyl acrylate into the polymer of formula (I) aforementioned. Introducing cycloalkyl acrylates makes polymerization easier and more controllable than introducing a norbornene. Furthermore, the properties of the polymer can be regulated by adjusting the ratio of cycloalkyl acrylate to acid-labile acrylate. The cycloalkyl acrylate could be chosen according to the polarity, adhesion, etching resistance, thermal properties, or transmittance. The following are suitable cycloalkyl acrylates: (wherein $R^4$ is H, $C_1$–$C_4$ alkyl, or $CF_3$)

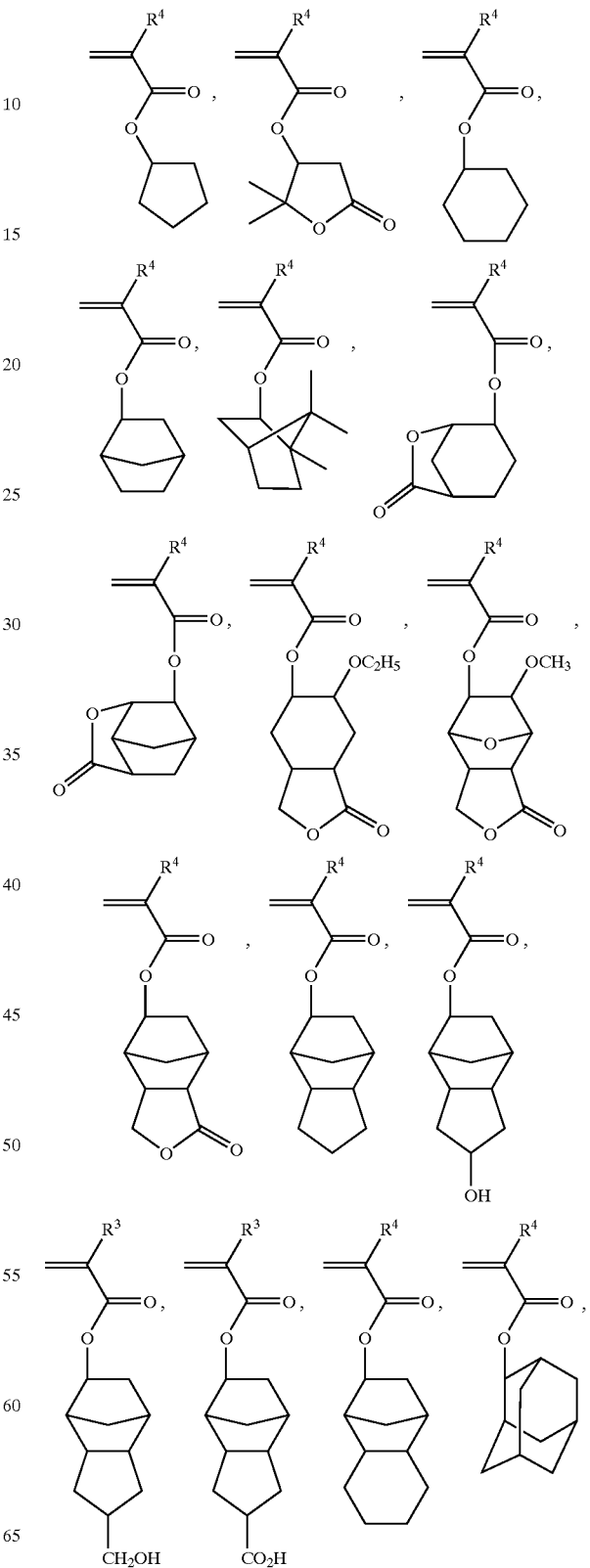

-continued

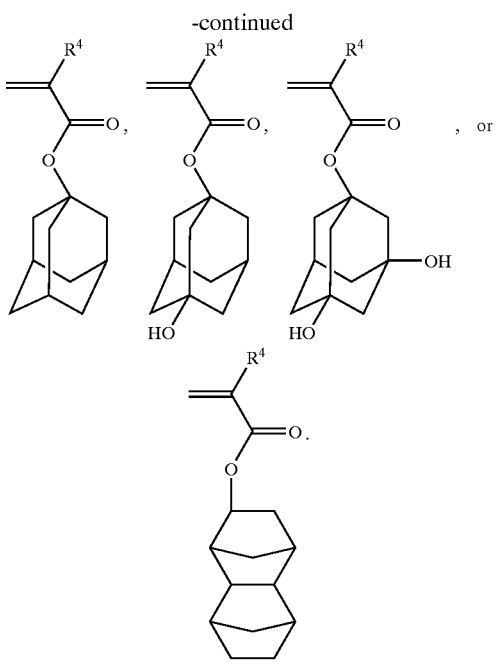

The cycloalkyl acrylates make the modification technique of the resist polymer more flexible and more diverse, which results in better photo-sensitivity and well-resolved images and profiles when the resist polymer is applied to the 193 nm lithographic process.

As mentioned above, a variety of polymers could be prepared by co-polymerizing the compound of formula (III) with Maleic anhydride, and additionally with some kinds of acrylate that have a protective or cycloalkyl group. The present invention uses different kinds of cycloalkyl vinyl ether and acrylates with a protective group, or introduces cycloalkyl acrylates into the polymer of formula (I) or (II) to form a variety of co-polymers and construct a VEMA polymer with various superior properties. The following discussion is aimed at the composition of the VEMA polymer, the techniques related to the polymerization reaction, and the physical properties of the polymers.

The polymers of the present invention can be either used alone or combined together to form a chemically-amplified resist composition.

The polymerization reaction used to form the polymers of the present invention is not limited. The polymerization reaction may perform an addition polymerization. Preferably, the polymerization reaction may mix the monomer reactants under the existence of catalyst initiators and suitable reaction conditions of controlled temperature and feed ratio to undergo a free radical polymerization. The catalyst initiators may be those well known to people skilled in this art. Preferably, the catalyst initiator is a well-known free radical initiator, such as azonitriles, alkyl peroxides, acyl peroxides, hydroperoxides, ketone peroxides, peresters, or peroxy carbonates. Most preferably, the catalyst initiators is tert-butyl peroxide (BPO), acetyl peroxide, 2,2'-azo-bis-isobutyronitrile (AIBN), 2,2'-azo-bis-2-methylbutyronitrile (AMBN), or dimethyl-2,2'-azo-bis-isobutyrate radical initiator (V-601).

Under the nitrogen atmosphere, the polymerization reaction is carried out using a proper solvent at a suitable reaction temperature, which is chosen according to the thermal degradation properties of the free radical initiator such that the initiator may perform a better reaction efficiency, raise the yield, make the polymerization technique more applicable, and accomplish the preparation of a superior VEMA polymer.

The VEMA polymer aforementioned of the present invention is dissoluble in resist solvents. The polymer has a glass transition temperature (Tg) ranging from 50 to 350° C.° C., a molecular weight (Mw) ranging from 1,000 to 300,000, a polymerization-dispersion index (PDI) ranging from 1 to 3, and a temperature of degradation (Td) greater than 80° C. Preferably, the polymer has a glass transition temperature (Tg) ranging from 60 to 210° C., a molecular weight (Mw) ranging from 3,000 to 50,000, a polymerization-dispersion index (PDI) ranging from 1 to 3, and a temperature of degradation (Td) greater than 80° C. Using a proper tool, such as gel permeation chromatography to determine the molecular weight and polymerization-dispersion index of the polymer.

The chemically-amplified resist composition of the present invention comprising the polymer of formula (I) or formula (II) may optionally comprise other components, such as photo-acid generators (PAG), acid quenchers, additives, or solvents.

The photo-acid generator used in the present invention is not restricted, as long as it can produce acids after being illuminated by UV radiation. Besides, the photo-acid generator needs a lower absorbance at a wavelength of 193 nm and a desirable stability before exposure to avoid affecting the reliability of the lithographic process. The preferred photo-acid generators are listed below: (wherein n of $C_nF_{2n+1}$ in the following structures is an integral from 1 to 12, and m of $C_mF_{2m+1}$ in the following structures is an integral from 1 to 12.)

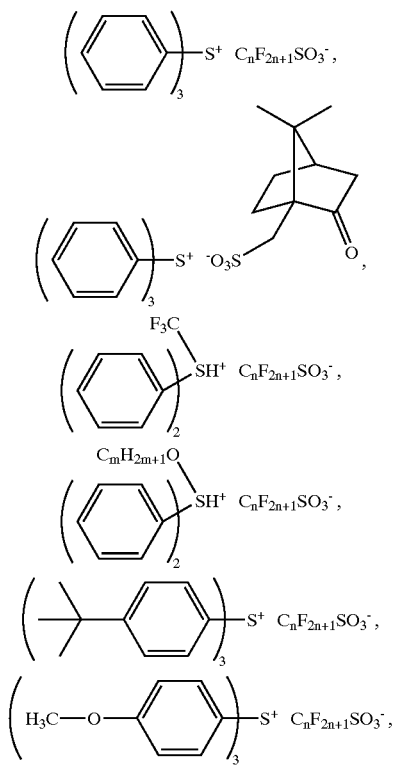

-continued
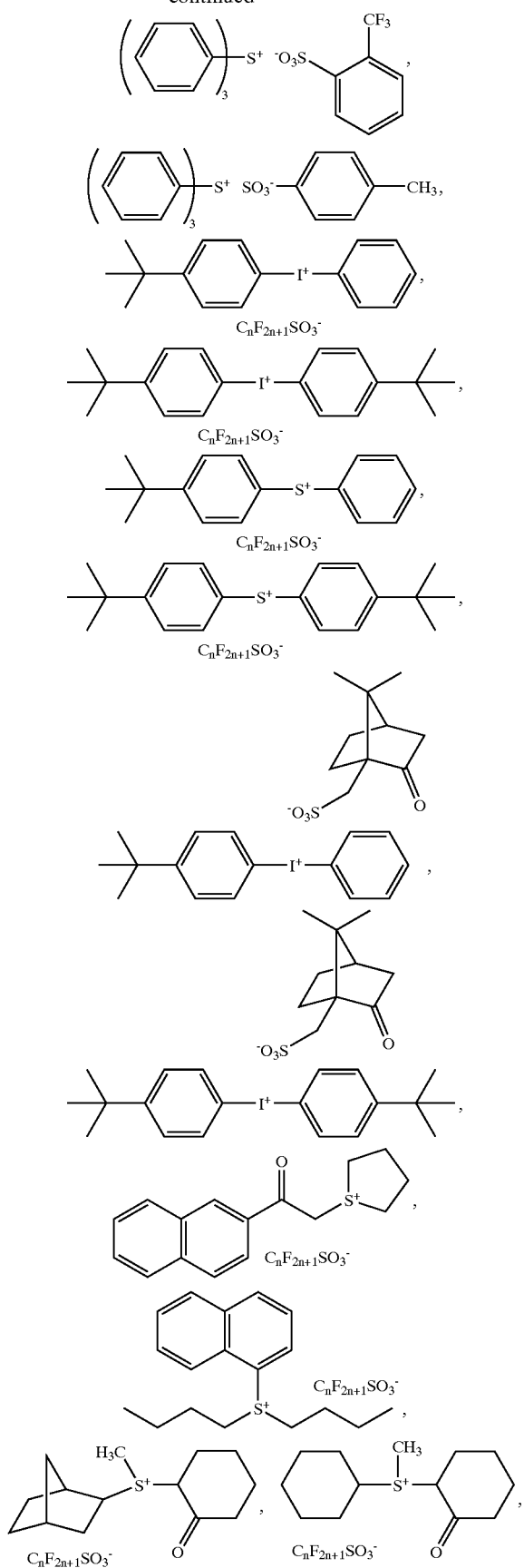
-continued
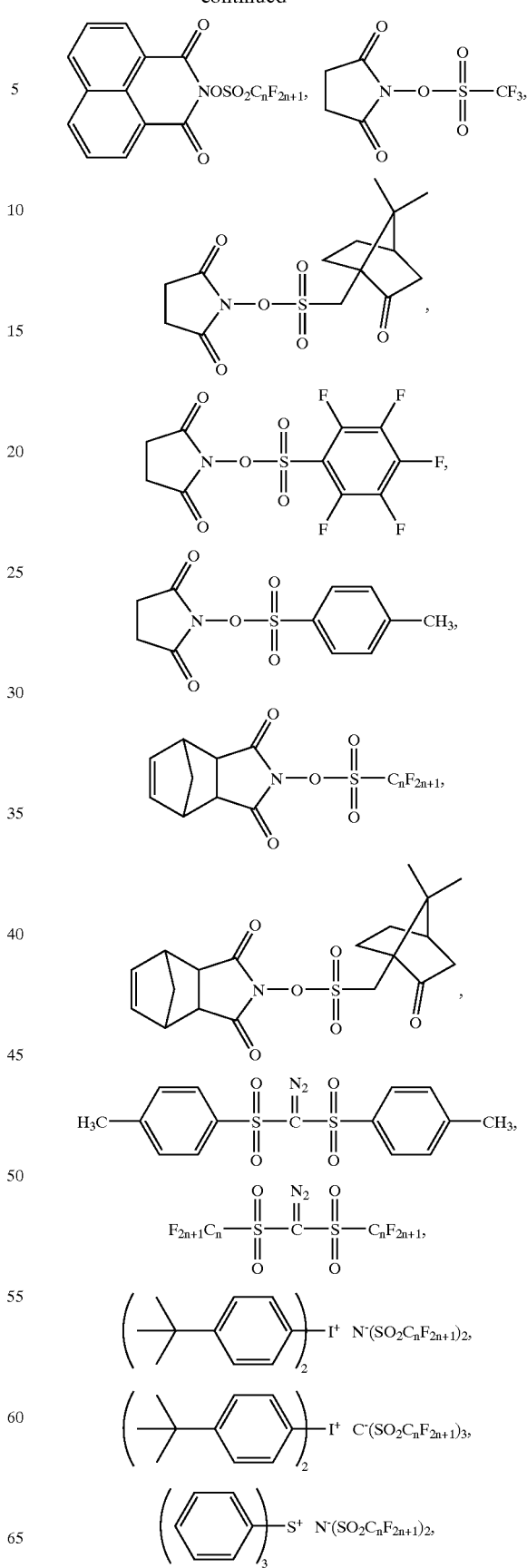

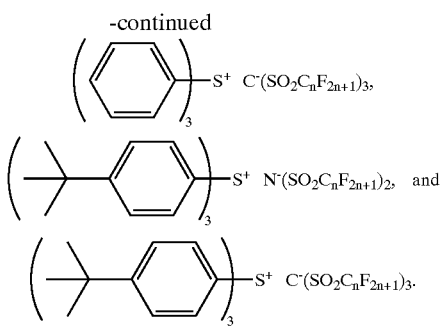

The aforementioned photo-acid generators can be used alone, or combined with one another or more. The photo-acid generator is added at 0.1–20 parts per 100 parts of resin in weight. Preferably, the photo-acid generator is added at 0.5–7 parts per 100 parts of resin in weight.

The acid quencher of the present invention is used to adjust the diffusition of acid ions produced by PAG in the resist and makes the properities of the resist better. The preferred acid quencher of the present invention is as following: tetrabutylammonium hydroxide, tetrabutylammonium lactate, tributylamine, trioctylamine, triethanolamine, tris[2-(2-methoxyethoxy)ethyl]amine, N-(2,3-dihydroxypropyl)piperidine, N-(2-hydroxyethyl)piperidine, morpholin, N-(2-hydroxyethyl)morpholin, N-(2-hydroxyethyl)pyrrolidine, or N-(2-hydroxyethyl)piperazine. The mole ratio of the acid quencher to PAG ranges from 0.1 to 50%, and preferably from 1 to 25%.

The additive of the present invention is not restricted and could optionally be sensitizers, dissolution inhibitors, surfactants, stabilizers, dyes, or other polymers according to the application requirements of the resist.

There is no special limit to the solvent of the chemical amplified photoresist compositions of the present invention. Preferably, the solvent suitable for the chemical amplified photoresist compositions of the present invention is higher alcohol (e.g. n-octanol), glycolic acid and its derivatives (e.g. methyl lactate, ethyl lactate and ethyl glycolate), glycolic ether and its derivatives (e.g. glycolic ethyl acetate, glycolic methyl acetate, glycerol methyl acetate), ketoesters (e.g. methyl acetoacetate, ethyl acetoacetate), alkoxy carboxylates (ethyl 2-ethoxyacetate, methyl 3-methoxypropionate, ethyl 3-ethoxypropionate, or methyl ethoxypropionate), ketones (methyl ethyl ketone, methyl pentyl ketone, acetylacetone cyclopentanone, cyclohexanone, or 2-heptanone), ketoethers (e.g. diacetoalcohol methyl ether), ketoalcohols (e.g. acetoalcohol or diacetone), alcohol ethers (e.g. glycolic butyl ether or propylene glycol ethyl ether), amides (e.g. dimethylacetamide or dimethyl formamide), ethers (e.g. phenyl ether or triethylene glycol dimethyl ether) or mixture thereof. Preferably, the solvent of the chemical amplified photoresist is n-octyl alcohol, propylene glycol mono methyl ether acetate, propylene glycol mono methyl ether propionate, ethyl 3-ethoxypropionate, ethyl 2-ethoxyacetate, methyl 3-methoxypropionate, methylethoxypropionate, methyl ethyl ketone, cyclopentanone, cyclohexanone, methyl lactate, ethyl lactate, glycolic butyl ether, propylene glycol ethyl ether or mixture thereof.

The solvent is usually added at 200–2,000 parts per 100 parts of resin in weight, and preferably 400–1,000 parts.

The amounts of impurities in the chemically-amplified resist composition should be as low as possible. The amounts of impurities can be lowered either by purifying each component before it is mixed to form the chemically-amplified resist composition, or by purifying the chemically-amplified resist composition after each component is mixed and before use.

The chemically-amplified resist composition of the present invention can be applied to a general lithographic process maturely, and more particularly, the chemically-amplified resist composition of the present invention can not only be used in traditional lithographic processes, but also be suitably applied to a lithographic process that uses the 193 nm wavelength.

The chemically-amplified resist composition of the present invention can be patterned through the well-known lithographic process. For example, apply the chemically-amplified resist composition on the substrates firstly, and then perform baking, exposing, and developing to achieve the lithographic process.

The substrates may be silicon wafers or other materials. The coating may be performed by spin-coating, spray-coating, or roller-coating. After coating, the substrates are usually put on the hot plates for heating and removing the solvents. After exposure through a photo mask, a desirable pattern will be formed on the substrates.

The developer could be a basic solution, such as ammonia, triethylamine, dimethylamine methanol, tetramethylammonium hydroxide, sodium hydroxide, potassium hydroxide, sodium carbonate, potassium carbonate, or hydroxyethyl trimethylammonium hydroxide.

The chemically-amplified resist composition of the present invention has excellent photo-sensitivity and forms well-resolved profiles. Furthermore, it shows better performance in the depth of focus, exposure latitude, and removal border.

PREPARATION EXAMPLE 1

Synthesizing the Polymer of Formula (I-1a)

Tetrahydrofuran (THF, 30 ml), tert-butyl methacrylate (2.84 g), maleic anhydride(3.92 g), and cyclohexyl vinyl ether (5.04 g) were put into the reactor, then 4.6 g of 2,2'-azo-bis-isobutyronitrile (AIBN) was added into the reactor, which was heated to 50° C° C. After the reaction was completed, 50 ml of THF was added, and then the whole solution was poured into a container that already contained 1 liter of isopropanol. Then a white powder was precipitated. After filtering the solution and drying the powder, a white polymer powder of formula (I-1 a) below was synthesized with a yield of 80%, a mean molecular weight of 13,100 (measured by GPC), and a Tg of 146° C.

PREPARATION EXAMPLE 2-24

Synthesizing the Polymers of Formula (I-2a) to (I-8a), (I-1b) to (I-8b), and (I-1c) to (I-8c)

The polymers of formula (I-2a) to (I-8a), (I-1b) to (I-8b), and (I-1c) to (I-8c) were prepared in a similar manner as described in preparation example 1, except that their monomers or compositions were different. The results are listed in the following table.

For illustrating the technique of the present invention, the polymers of formula (I-1) to (I-8) and (II-1) to (II-8) as shown below were given as examples of polymer platform for the synthesis of other polymers, as shown in the column of the polymer platform.

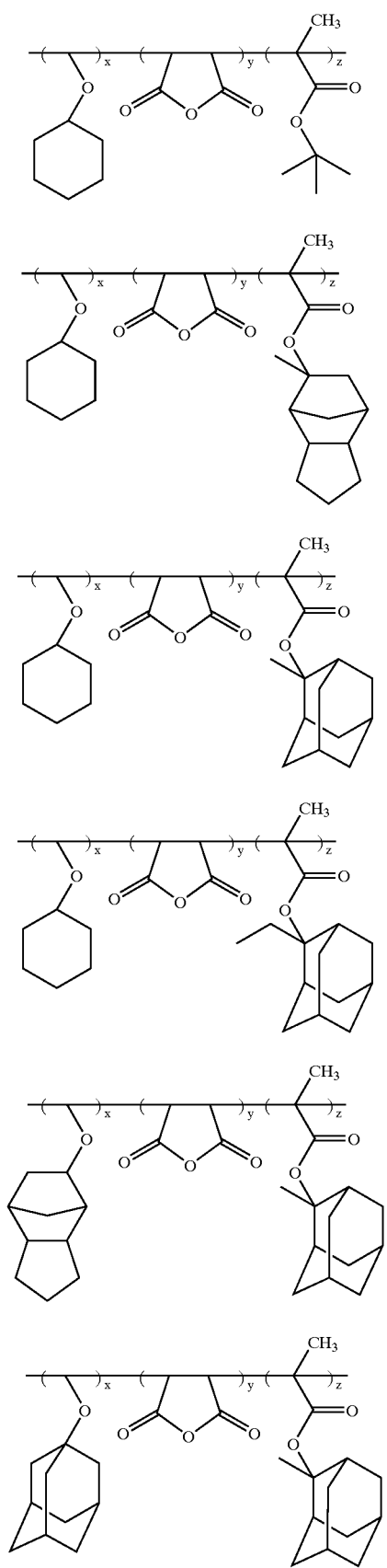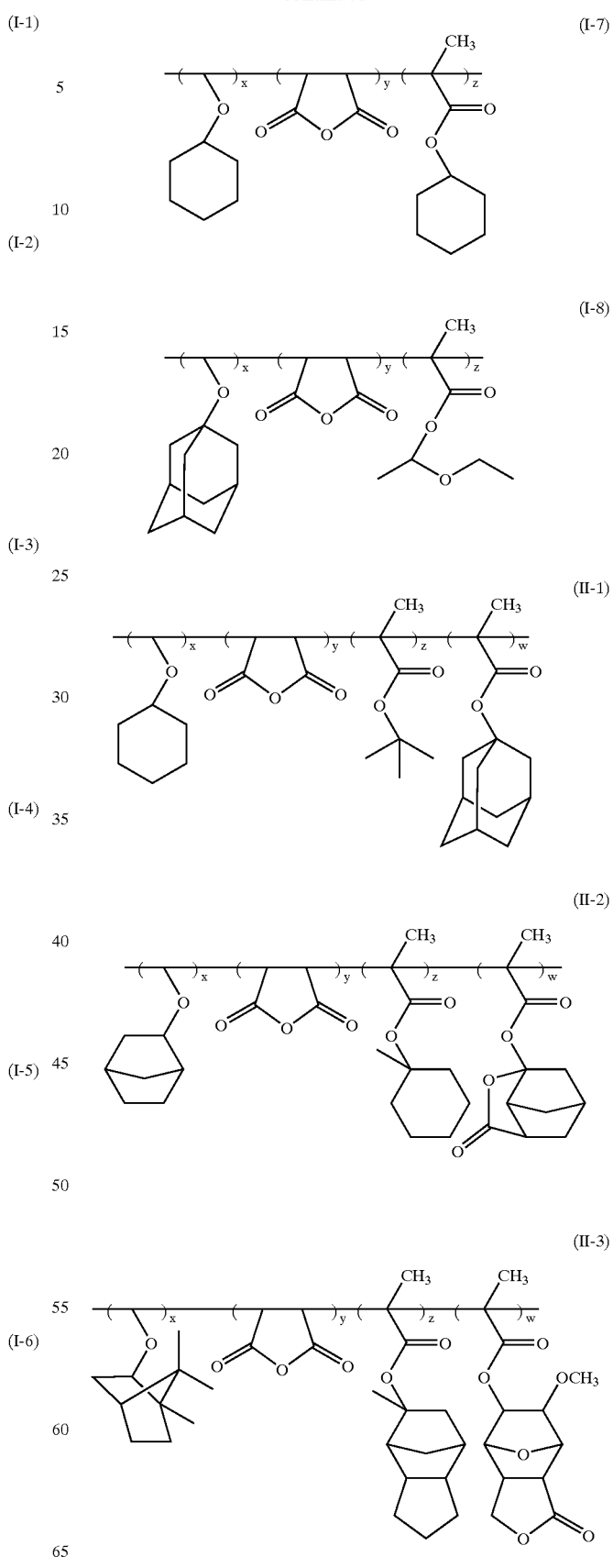

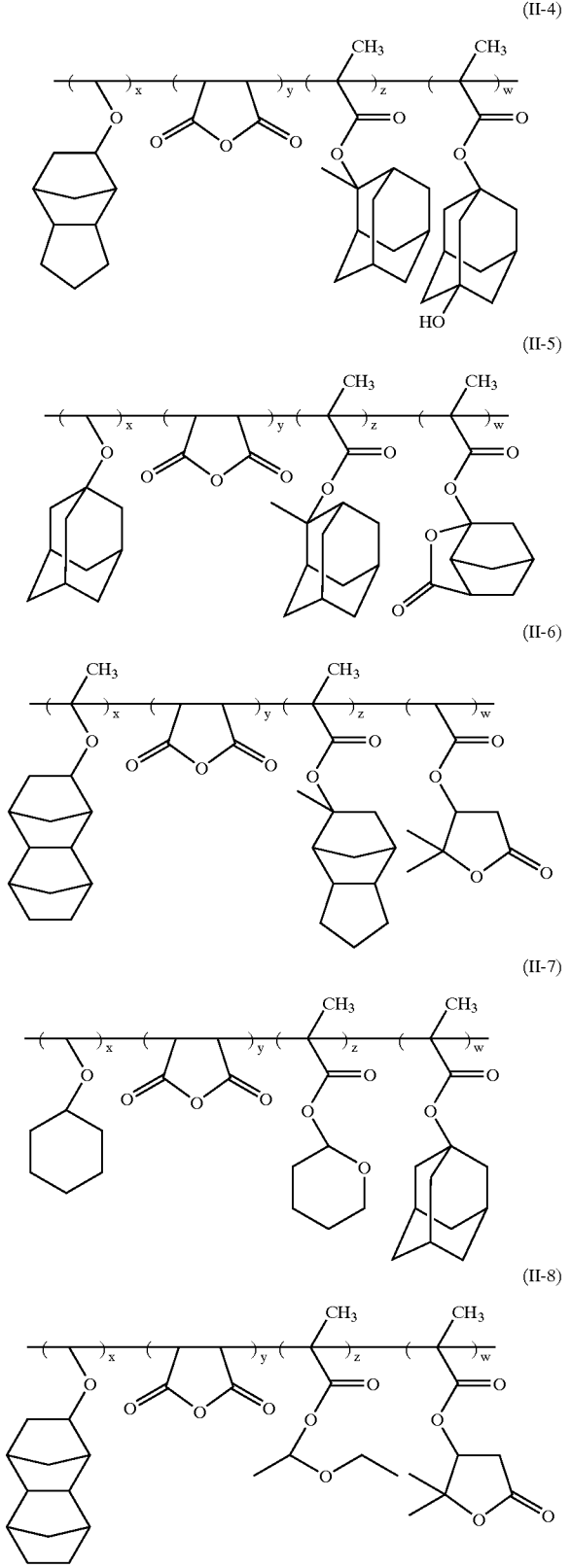

Formulae (I-1) to (I-8) and (II-1) to (II-8) were marked with a, b, or c for denoting the various compositions thereof. The preparation examples 1 to 40 in the following table 1 and 2 show the preparation methods and synthesis results.

TABLE 1

| Polymer platform | Preparation example/ Formula | x | y | z | Mw (g/mol) |
|---|---|---|---|---|---|
| Polymer (I-1) | Preparation example 1/ Formula (I-1a) | 0.4 | 0.4 | 0.2 | 13,100 |
|  | Preparation example 2/ Formula (I-1b) | 0.35 | 0.35 | 0.3 | 22,300 |
|  | Preparation example 3/ Formula (I-1c) | 0.3 | 0.3 | 0.4 | 18,600 |
| Polymer (I-2) | Preparation example 4/ Formula (I-2a) | 0.4 | 0.4 | 0.2 | 17,900 |
|  | Preparation example 5/ Formula (I-2b) | 0.35 | 0.35 | 0.3 | 9,200 |
|  | Preparation example 6/ Formula (I-2c) | 0.3 | 0.3 | 0.4 | 21,300 |
| Polymer (I-3) | Preparation example 7/ Formula (I-3a) | 0.4 | 0.4 | 0.2 | 16,300 |
|  | Preparation example 8/ Formula (I-3b) | 0.35 | 0.35 | 0.3 | 11,200 |
|  | Preparation example 9/ Formula (I-3c) | 0.3 | 0.3 | 0.4 | 21,100 |
| Polymer (I-4) | Preparation example 10/ Formula (I-4a) | 0.4 | 0.4 | 0.2 | 7,800 |
|  | Preparation example 11/ Formula (I-4b) | 0.35 | 0.35 | 0.3 | 6,300 |
|  | Preparation example12/ Formula (I-4c) | 0.3 | 0.3 | 0.4 | 9,600 |
| Polymer (I-5) | Preparation example13/ Formula (I-5a) | 0.4 | 0.4 | 0.2 | 15,100 |
|  | Preparation example14/ Formula (I-5b) | 0.35 | 0.35 | 0.3 | 20,800 |
|  | Preparation example15/ Formula (I-5c) | 0.3 | 0.3 | 0.4 | 8,600 |
| Polymer (I-6) | Preparation example16/ Formula (I-6a) | 0.4 | 0.4 | 0.2 | 8,600 |
|  | Preparation example17/ Formula (I-6b) | 0.35 | 0.35 | 0.3 | 20,300 |
|  | Preparation example18/ Formula (I-6c) | 0.3 | 0.3 | 0.4 | 10,800 |
| Polymer (I-7) | Preparation example19/ Formula (I-7a) | 0.4 | 0.4 | 0.2 | 18,600 |
|  | Preparation example20/ Formula (I-7b) | 0.35 | 0.35 | 0.3 | 19,700 |
|  | Preparation example21/ Formula (I-7c) | 0.3 | 0.3 | 0.4 | 16,600 |
| Polymer (I-8) | Preparation example22/ Formula (I-8a) | 0.4 | 0.4 | 0.2 | 17,600 |
|  | Preparation example23/ Formula (I-8b) | 0.35 | 0.35 | 0.3 | 22,300 |
|  | Preparation example24/ Formula (I-8c) | 0.3 | 0.3 | 0.4 | 19,800 |

TABLE 2

| Polymer platform | Preparation example/ Formula | x | y | z | w | Mw (g/mol) |
|---|---|---|---|---|---|---|
| Polymer (II-1) | Preparation example 25/ Formula (II-1a) | 0.35 | 0.35 | 0.2 | 0.1 | 15,500 |
| | Preparation example 26/ Formula (II-1b) | 0.3 | 0.3 | 0.3 | 0.1 | 20,900 |
| Polymer (II-2) | Preparation example 27/ Formula (II-2a) | 0.35 | 0.35 | 0.2 | 0.1 | 21,500 |
| | Preparation example 28/ Formula (II-2b) | 0.3 | 0.3 | 0.3 | 0.1 | 23,300 |
| Polymer (II-3) | Preparation example 29/ Formula (II-3a) | 0.35 | 0.35 | 0.2 | 0.1 | 17,400 |
| | Preparation example 30/ Formula (II-3b) | 0.3 | 0.3 | 0.3 | 0.1 | 15,200 |
| Polymer (II-4) | Preparation example 31/ Formula (II-4a) | 0.35 | 0.35 | 0.2 | 0.1 | 19,300 |
| | Preparation example 32/ Formula (II-4b) | 0.3 | 0.3 | 0.3 | 0.1 | 6,400 |
| Polymer (II-5) | Preparation example 33/ Formula (II-5a) | 0.35 | 0.35 | 0.2 | 0.1 | 9,400 |
| | Preparation example 34/ Formula (II-5b) | 0.3 | 0.3 | 0.3 | 0.1 | 22,900 |
| Polymer (II-6) | Preparation example 35/ Formula (II-6a) | 0.35 | 0.35 | 0.2 | 0.1 | 7,800 |
| | Preparation example 36/ Formula (II-6b) | 0.3 | 0.3 | 0.3 | 0.1 | 9,900 |
| Polymer (II-7) | Preparation example 37/ Formula (II)-7a) | 0.35 | 0.35 | 0.2 | 0.1 | 18,900 |
| | Preparation example 38/ Formula (II-7b) | 0.3 | 0.3 | 0.3 | 0.1 | 26,300 |
| Polymer (II-8) | Preparation example 39/ Formula (II-8a) | 0.35 | 0.35 | 0.2 | 0.1 | 16,600 |
| | Preparation example 40/ Formula (II-8b) | 0.3 | 0.3 | 0.3 | 0.1 | 22,900 |

EXAMPLE 1

The Prescription of the Resist Composition

Mixed 4 g of the polymer of formula (I-1a) made from preparation example 1, 0.08 g of triphenylsulfonium perfluoro-1-butane sulfonate (TPS-PFBS), 0.8 g of tert-butyl cholate (TBC), 35 g of propylene glycol monomethyl ether acetate (PGMEA), and 20 mg of tetrabutylammonium hydroxide uniformly to form a solution. The solution was filtered with a 0.45 μm filter and then coated on an Si wafer, which was then spun at a rate of 3000 rpm for 20 seconds. Finally, a uniform and thin film was formed.

The thin film was dried at 130° C. for 60 seconds, and the thickness of the thin film became 290.2 nm. After that, the thin film was exposed to DUV whose wavelength is 193 nm and energy is from 10 to 30 mj/cm$^2$, and then heated by a heater at 130° C. for post-exposure baking.

In the following, the exposed film was developed by 2.38% tetramethyl ammonium hydroxide (TMAH), rinsed by de-ionized water, and dried by spinning in turn. The SEM pictures show the microstructure of the resist has a resolution of 0.13 μm.

EXAMPLE 2-11

The Prescriptions of the Resist Compositions

Example 2-11 were prepared in a similar manner as described in example 1, except that the polymers were prepared by other preparation examples. The results are listed in the following table 3:

TABLE 3

| | Polymer | Film thickness (nm) | Resolution (μm) |
|---|---|---|---|
| Example1 | (I-1a) | 290.2 | 0.13 |
| Example2 | (I-4b) | 296.5 | 0.15 |
| Example3 | (I-4c) | 288.3 | 0.15 |
| Example4 | (I-5b) | 278.3 | 0.15 |
| Example5 | (I-6c) | 269.8 | 0.18 |
| Example6 | (I-8a) | 267.1 | 0.14 |
| Example7 | (II-1a) | 262.9 | 0.15 |
| Example8 | (II-4a) | 316.4 | 0.15 |
| Example9 | (II-5a) | 309.7 | 0.14 |
| Example10 | (II-6a) | 309.7 | 0.13 |
| Example11 | (II-7a) | 309.7 | 0.14 |

The chemically-amplified resist compositions of the present invention not only can be applied maturely to general lithographic processes, especially to 193 nm lithographic process, but also have excellent photo-sensitivity, and can form well-resolved patterns and profiles.

In order to clarify the novelty and un-obviousness, a comparative example using a polymer platform of formula (IV) below is given. The compositions and synthesis results are listed in the table 4 below, wherein the resist using polymer of formula (IV) as the polymer platform was compared with that using polymer of formula (I-2).

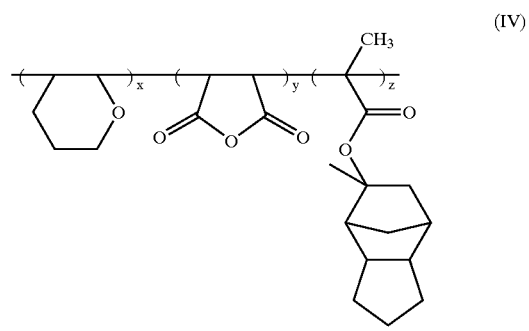

(IV)

TABLE 4

| Polymer platform | x | y | z | Yield (%) | Mw (g/mol) | Tg (° C.) |
|---|---|---|---|---|---|---|
| Polymer (IV) | 0.4 | 0.4 | 0.2 | 47.63 | 12,600 | 145.4 |
| Polymer (I-2) | 0.4 | 0.4 | 0.2 | 80.6 | 16,300 | 151.8 |

Comparative Example 1

The Synthesis of Polymer of Formula (IV)

30 ml of tetrahydrofuran (THF), 4.68 g of 8-methyltricyclo[5.2.1.0$^{2,6}$]dec-8-yl methacrylate, 3.92 g of maleic anhydride, and 3.36 g of 3,4-dihydro-2H-pyran were put into the reactor, then 0.65 g of 2,2'-azo-bis-isobutyronitrile (AIBN) initiator was added into the reactor, which was then heated to 70° C. After the reation was completed, 20 ml of THF was added, and then the whole solution was poured into a container that already contained 1 liter of isopropanol. Then a white powder was precipitated. After filtering the solution and drying the powder, 5.69 g of white polymer powder of formula (IV) was synthesized with a yield of 47.63%, a mean molecular weight of 12,600 (measured by GPC), and a Tg of 145.45° C.° C. Because the reaction rate of 8-methyltricyclo[5.2.1.0$^{2,6}$]dec-8-yl methacrylate is far faster than that of maleic anhydride and 3,4-dihydro-2H-pyran, the product is mostly formed from the self-polymerization of 8-methyltricyclo[5.2.1.0$^{2,6}$]dec-8-yl methacrylate, which results in poor uniformity of the polymer composition and low yield.

If the procedure of feeding in polymer synthesis is alternated, the low yield and non-uniform reaction may be improved. However, the alternated procedure will make the reaction hard to be controlled and make the qualities of each batch of products differ from one another.

Take the synthesis procedure of the polymer of formula (I-10) for example and compare that of the polymer of formula (IV). The polymer of formula (I-10) is more easily synthesized, has a higher yield (80.65%) and composition uniformity, and can react with the acrylates uniformly to form a polymer platform composed of four ingredients, such that the properties of the polymer can be regulated flexibly. Accordingly, the objectives of the present invention are achieved, ie: to create a polymer platform with good activity, to have an economical effect, and excellent modification potential, and to make chemically-amplified resist compositions having superior properties for lithography.

Although the present invention has been explained in relation to its preferred embodiment, it is to be understood that many other possible modifications and variations can be made without departing from the scope of the invention as hereinafter claimed.

What is claimed is:

1. A chemically-amplified resist composition comprising a photo-acid generator (PAG) and a polymer of formula (I) below:

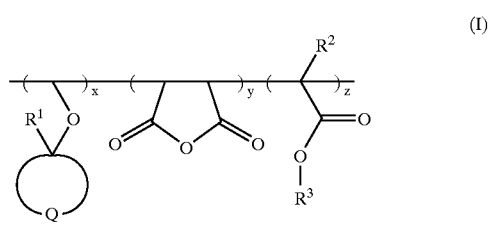

(I)

wherein $R^1$ is H, $C_1$–$C_4$ alkyl, or $CF_3$; Q is $C_4$–$C_{12}$ cycloalkyl; $R^2$ is H, $C_1$–$C_4$ alkyl, or $CF_3$; $R^3$ is $C_4$–$C_{12}$ branched or cyclic alkyl; and x>0, y>0, z>0, x+y+z equals to 1.

2. The resist composition as claimed in claim 1, wherein Q is selected from the group consisting of cyclohexyl, isobornyl, adamantyl, tricyclo[5.2.1.0$^{2,6}$]dec-8-yl, and tetracyclo[6.2.1.1$^{3,6}$.0$^{2,7}$]dodec-9-yl.

3. The resist composition as claimed in claim 1, wherein $R^3$ is tert-butyl, 1-methyl-1-cyclohexyl, 1-ethyl-1-cyclohexyl, 2-methyl-2-adamantyl, 2-ethyl-2-adamantyl, 8-methyltricyclo[5.2.1.0$^{2,6}$]dec-8-yl, 8-ethyltricyclo[5.2.1.0$^{2,6}$]dec-8-yl, 9-methyltetracyclo[6.2.1.1$^{3,6}$.0$^{2,7}$]dodec-9-yl, or 9-ethyltetracyclo[6.2.1.1$^{3,6}$.0$^{2,7}$]dodec-9-yl.

4. The resist composition as claimed in claim 1, wherein x/(x+y+z) ranges from 0.1 to 0.45; y/(x+y+z) ranges from 0.1 to 0.45; and z/(x+y+z) ranges from 0.1 to 0.8.

5. The resist composition as claimed in claim 1, wherein the glass transition temperature (Tg) of said polymer ranges from 50 to 350° C.; the molecular weight (Mw) of said polymer ranges from 1,000 to 300,000; the polymerization-dispersion index (PDI) of said polymer ranges from 1 to 3; and the temperature of degradation (Td) is greater than 80 0° C.

6. The resist composition as claimed in claim 1, wherein said formula (I) is selected from the group consisting of formulas (I-1), (I-2), (I-3), (I-4), (I-5), (I-6), (I-7), and (I-8).

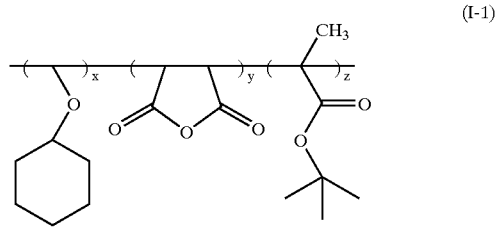

(I-1)

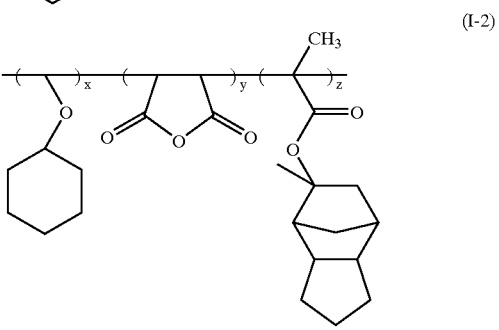

(I-2)

(I-3)
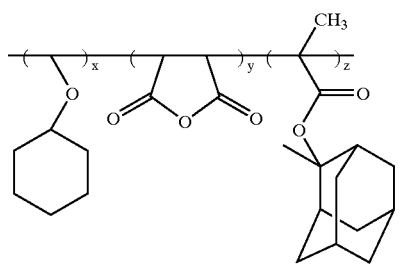

(I-4)
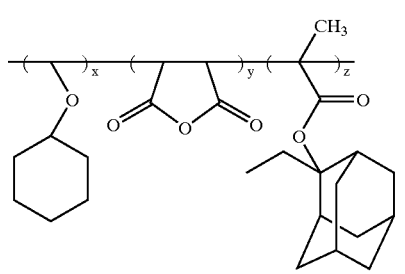

(I-5)
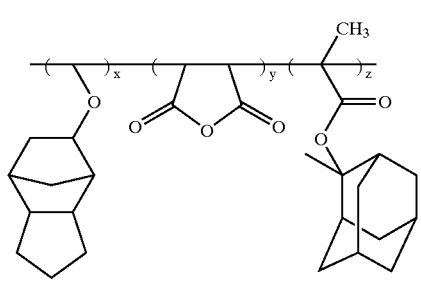

(I-6)
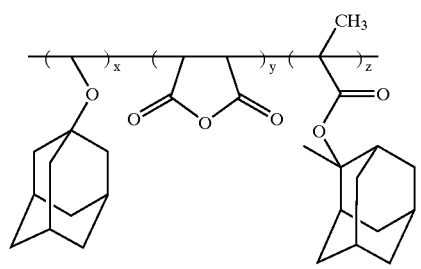

(I-7)
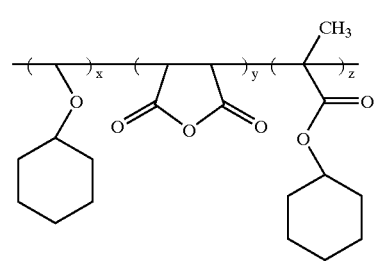

(I-8)
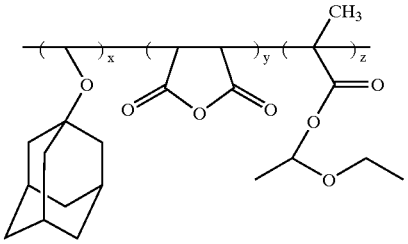

7. A chemically-amplified resist composition comprising a photo-acid generator (PAG) and a polymer of formula (II) below:

(II)

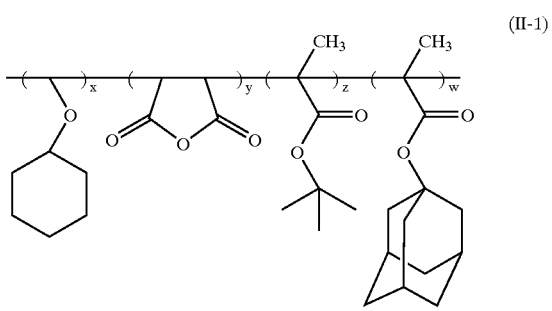

wherein $R^1$ is H, $C_1$–$C_4$ alkyl, or $CF_3$; Q is $C_4$–$C_{12}$ cycloalkyl; $R^2$ is H, $C_1$–$C_4$ alkyl, or $CF_3$; $R^3$ is $C_4$–$C_{12}$ branched or cyclic alkyl; $R^4$ is H, $C_1$–$C_4$ alkyl, or $CF_3$; $R^5$ is $C_4$–$C_{12}$ cycloalkyl; and x>0, y>0, z>0, w>0, x+y+z+w equals to 1.

8. The resist composition as claimed in claim 7, wherein Q is selected from the group consisting of cyclohexyl, isobornyl, adamantyl, tricyclo[5.2.1.0$^{2,6}$]dec-8-yl, and tetracyclo[6.2.1.1$^{3,6}$.0$^{2,7}$]dodec-9-yl.

9. The resist composition as claimed in claim 7, wherein $R^3$ is tert-butyl, 1-methyl-1-cyclohexyl, 1-ethyl-1-cyclohexyl, 2-methyl-2-adamantyl, 2-ethyl-2-adamantyl, 8-methyltricyclo[5.2.1.0$^{2,6}$]dec-8-yl, 8-ethyltricyclo[5.2.1.0$^{2,6}$]dec-8-yl, 9-methyltetracyclo[6.2.1.1$^{3,6}$.0$^{2,7}$]dodec-9-yl, or 9-ethyltetracyclo[6.2.1.1$^{3,6}$.0$^{2,7}$]dodec-9-yl.

10. The resist composition as claimed in claim 7, wherein $R^4$ is H, $C_1$–$C_4$ alkyl, or $CF_3$.

11. The resist composition as claimed in claim 7, wherein x/(x+y+z+w) ranges from 0.1 to 0.425; y/(x+y+z+w) ranges from 0.1 to 0.425; z/x+y+z+w) ranges from 0.1 to 0.8; and w/x+y+z+w) ranges from 0.05 to 0.5.

12. The resist composition as claimed in claim 7, wherein the glass transition temperature (Tg) of said polymer ranges from 50 to 350° C.; the molecular weight (Mw) of said polymer ranges from 1,000 to 300,000; the polymerization-dispersion index (PDI) of said polymer ranges from 1 to 3; and the temperature of degradation (Td) is greater than 80° C.

13. The resist composition as claimed in claim 7, wherein said formula (II) is selected from the group consisting of formulas (II-1), (II-2), (II-3), (II-4), (II-5), (II-6), (II-7), and (II-8)

(II-1)

(II-2)
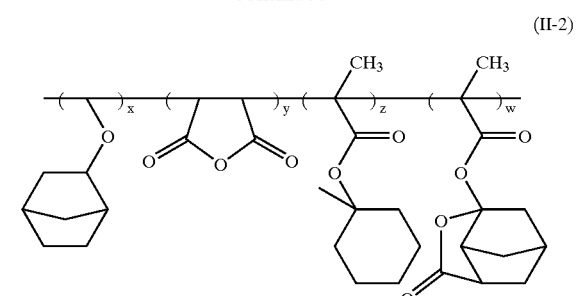
(II-3)
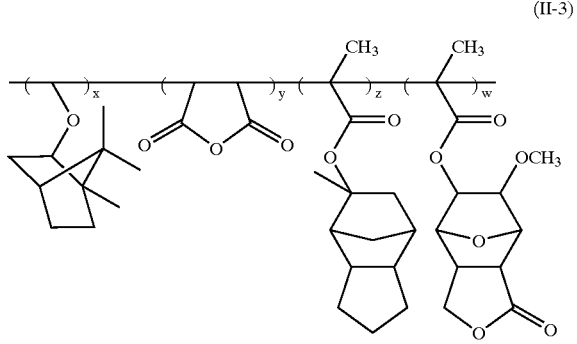
(II-4)
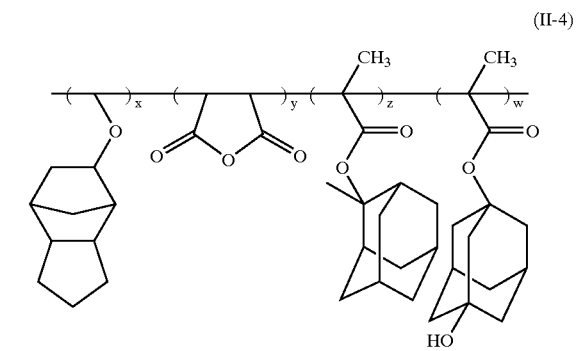
(II-5)
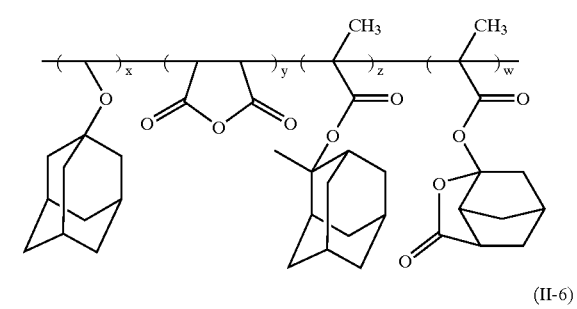
(II-6)
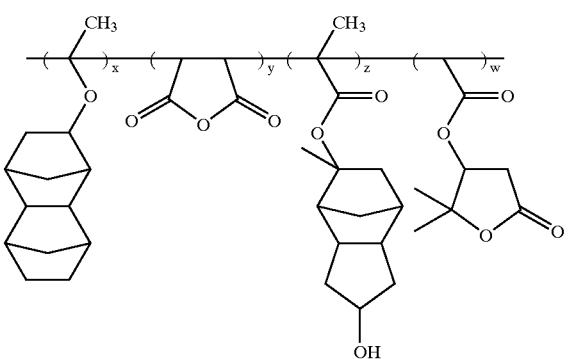
(II-7)
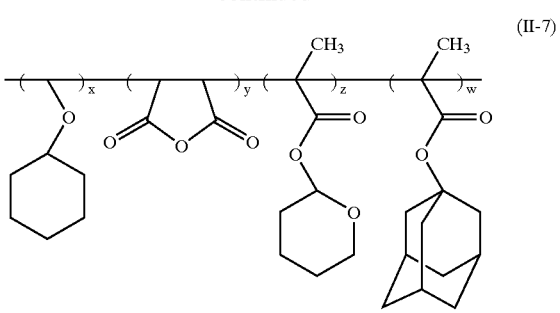
(II-8)
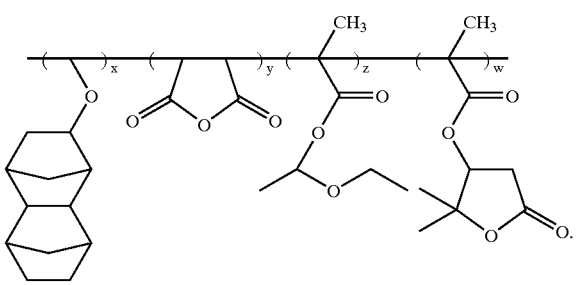
14. The resist composition as claimed in claim 1 or 7, wherein said photo-acid generator is selected from the group consisting of
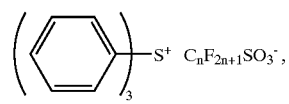
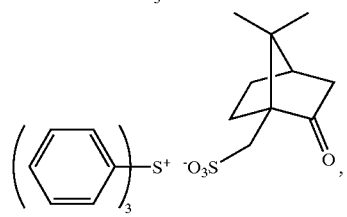
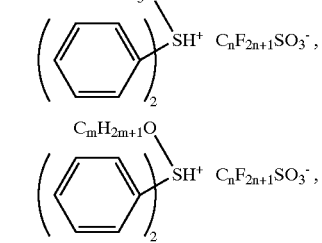
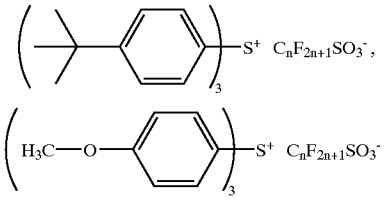
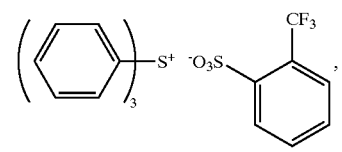

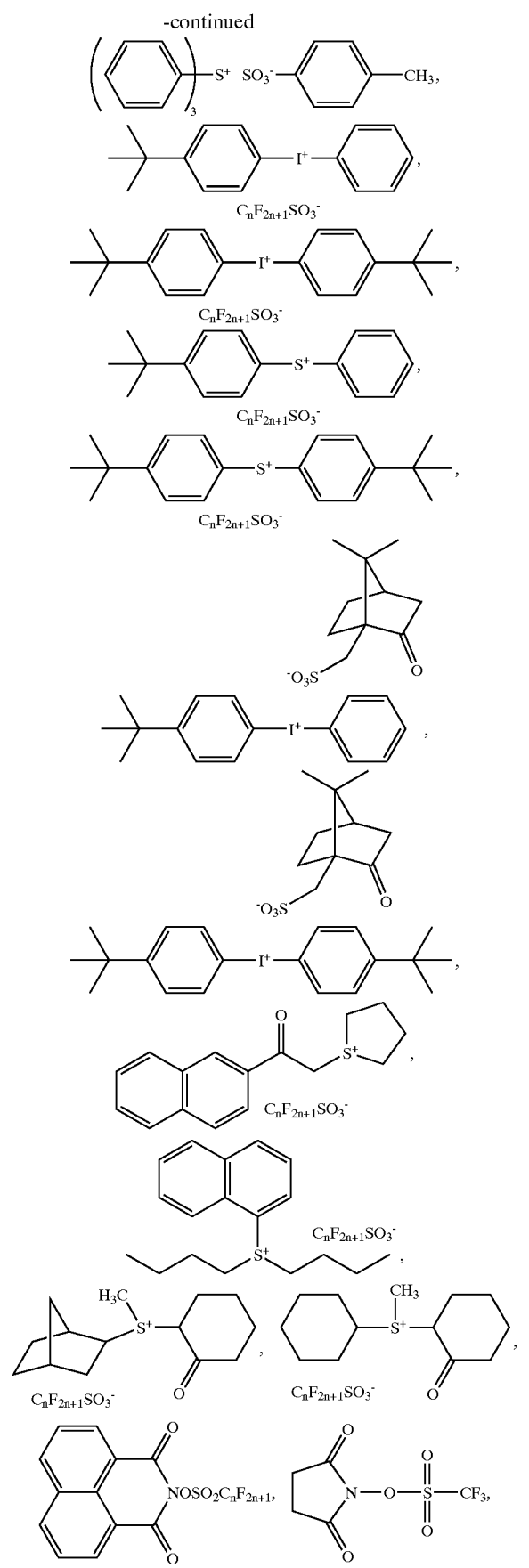
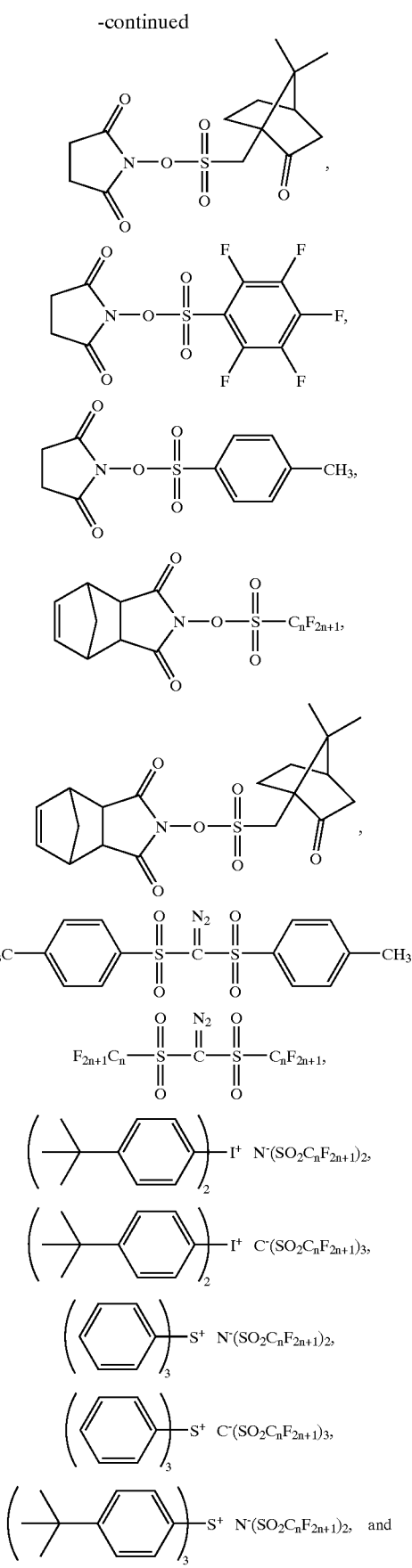

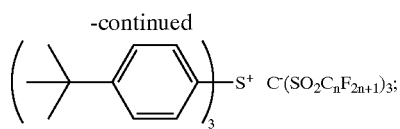

wherein n and m are integrals ranging from 1 to 12 independently.

15. The resist composition as claimed in claim 1 or 7, wherein said photo-acid generator is added at 0.1–20 parts per 100 parts of resin in weight.

16. The resist composition as claimed in claim 1 or 7 further comprising an acid quencher.

17. The resist composition as claimed in claim 15, wherein said acid quencher is selected from the group consisting of tetrabutylammonium hydroxide, tetrabutylammonium lactate, tributylamine, trioctylamine, triethanolamine, tris[2-(2-methoxyethoxy)ethyl]amine, N-(2,3-dihydroxypropyl)piperidine, N-(2-hydroxyethyl)piperidine, morpholin, N-(2-hydroxyethyl)morpholin, N-(2-hydroxyethyl)pyrrolidine, N-(2-hydroxyethyl)piperazine, and the combination thereof.

18. The resist composition as claimed in claim 15, wherein the molar ratio of said acid quencher to said photo-acid generator ranges from 0.1 to 50%.

* * * * *